(12) United States Patent
Yang et al.

(10) Patent No.: US 12,300,551 B2
(45) Date of Patent: May 13, 2025

(54) METHOD FOR FORMING SEMICONDUCTOR STRUCTURE

(71) Applicant: Taiwan Semiconductor Manufacturing Company, Ltd., Hsinchu (TW)

(72) Inventors: Chih-Hsin Yang, Zhubei (TW); Dian-Hau Chen, Hsinchu (TW); Yen-Ming Chen, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 540 days.

(21) Appl. No.: 17/824,263

(22) Filed: May 25, 2022

(65) Prior Publication Data

US 2023/0386940 A1    Nov. 30, 2023

(51) Int. Cl.
*H01L 21/66* (2006.01)
*H01L 23/532* (2006.01)
*H01L 23/00* (2006.01)

(52) U.S. Cl.
CPC .............. *H01L 22/12* (2013.01); *H01L 22/14* (2013.01); *H01L 23/53295* (2013.01); *H01L 22/26* (2013.01); *H01L 24/13* (2013.01); *H01L 2224/13009* (2013.01); *H01L 2224/13021* (2013.01)

(58) Field of Classification Search
CPC ......... H01L 22/12; H01L 22/14; H01L 22/26; H01L 23/53295; H01L 24/13; H01L 2224/13009; H01L 2224/13021
See application file for complete search history.

(56) References Cited

U.S. PATENT DOCUMENTS

| | | | |
|---|---|---|---|
| 10,026,724 B2 * | 7/2018 | Kim | H01L 21/6835 |
| 11,515,276 B2 * | 11/2022 | Kuo | H01L 24/19 |
| 2013/0249589 A1 * | 9/2013 | Chen | H01L 22/14 324/762.01 |
| 2020/0350221 A1 * | 11/2020 | Liu | H01L 22/32 |
| 2022/0020735 A1 * | 1/2022 | Song | H01L 24/80 |
| 2022/0359315 A1 * | 11/2022 | Liu | H01L 23/3157 |
| 2024/0105526 A1 * | 3/2024 | Lo | H01L 24/11 |

* cited by examiner

*Primary Examiner* — Michael M Trinh
(74) *Attorney, Agent, or Firm* — Birch, Stewart, Kolasch & Birch, LLP

(57) ABSTRACT

A method for forming a semiconductor structure is provided. The method includes forming an interconnect structure, and forming a conductive feature electrically connected to the interconnect structure. The method also includes forming a first passivation layer over the interconnect structure and the conductive feature, and etching the first passivation layer to form an opening that exposes the conductive feature. The method further includes performing an electrical test on the conductive feature, filling the opening with an oxide material, and attaching a carrier substrate over the oxide material using a bonding layer.

20 Claims, 13 Drawing Sheets

METHOD FOR FORMING SEMICONDUCTOR STRUCTURE

BACKGROUND

The semiconductor industry continues to improve the integration density of various electronic components (e.g., transistors, diodes, resistors, capacitors, etc.) by continual reductions in minimum feature size, which allow more components to be integrated into a given area. The individual dies are typically packaged separately. A package not only provides protection for semiconductor devices from environmental contaminants, but also provides a connection interface for the semiconductor devices packaged therein.

Three dimensional integrated circuits (3DICs) are a recent development in semiconductor packaging in which multiple semiconductor dies are stacked upon one another, such as package-on-package (PoP) and system-in-package (SiP) packaging techniques. Some 3DICs are prepared by placing dies over dies on a semiconductor wafer level. 3DICs provide improved integration density and other advantages, such as faster speeds and higher bandwidth, because of the decreased length of interconnects between the stacked dies, for example. However, there are many challenges related to 3DICs.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion. The figures may be simplified for the sake of clarity to better understand different aspects of the disclosure.

DETAILED DESCRIPTION

Figure 1:
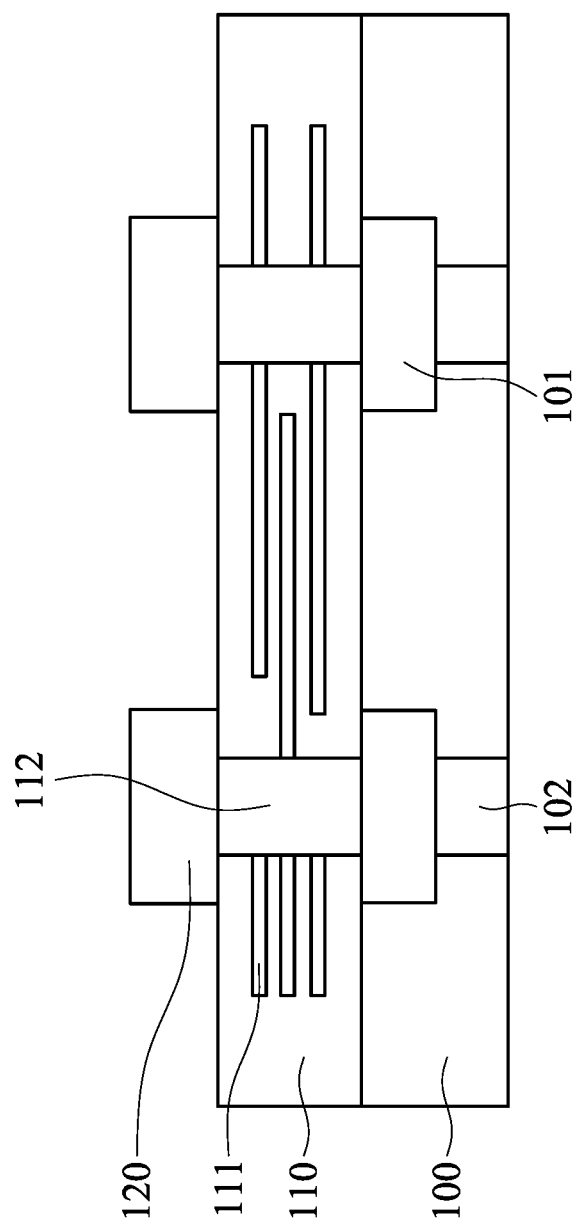
FIGS. 1, 2A, 2B, 3A, 3B, 4A, 4B, 5A, 5B, 6A, 6B, 7A, 7B, 8A, 8B, 9A, 9B, 10A, and 10B are cross-sectional views illustrating various stages of forming a semiconductor structure, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and methods for forming the same are provided. The method for forming the semiconductor structure may include conducting an electrical test prior to the integration of the SoC or SoIC die structure. Accordingly, it is more likely to detect a malfunctioning semiconductor structure as early as possible, thereby the yield of the semiconductor structure may be increased, saving time and money. In addition, the formation of the adhesive layer helps to enhance the attachment between the second passivation layer and the oxide material, increasing the structural strength of the semiconductor structure.

FIGS. 1, 2A, 2B, 3A, 3B, 4A, 4B, 5A, 5B, 6A, 6B, 7A, 7B, 8A, 8B, 9A, 9B, 10A, and 10B are cross-sectional views illustrating various stages of forming a semiconductor structure 10, in accordance with some embodiments of the disclosure. The semiconductor structure 10 may be a device wafer including active devices (e.g., transistors) and/or passive devices (e.g., capacitors, inductors, resistors, or the like). In some embodiments, the semiconductor structure 10 is an interposer wafer, which may or may not include active devices and/or passive devices. In accordance with yet another embodiment of the present disclosure, the semiconductor structure 10 is a package substrate strip, which may be package substrates with cores therein or may be core-less package substrates. In subsequent discussion, a device wafer is used as an example of the semiconductor structure 10. The teaching of the present disclosure may also be applied to interposer wafers, package substrates, or other semiconductor structures, as skilled artisans readily appreciate.

As shown in FIG. 1, the semiconductor structure 10 includes a semiconductor substrate 100. In some embodiments, one or more electrical component (not shown) is formed on or in the semiconductor substrate 100. For example, the electrical component may include transistors (e.g., Complementary Metal-Oxide Semiconductor (CMOS) transistors), resistors, capacitors, inductors, diodes, or any other suitable electrical component, and may be formed using any suitable method, details are not discussed here. In some embodiments, the semiconductor substrate 100 and the electrical component formed thereon may be collectively referred to as the semiconductor substrate 100. The semiconductor substrate 100 may include a semiconductor material, such as silicon, doped or undoped, or an active layer of a semiconductor-on-insulator (SOI) substrate. The semiconductor substrate 100 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some embodiments, the semiconductor substrate 100 includes a plurality of conductive structures 101 and a plurality of conductive vias 102 electrically connected to the conductive structures 101. It is noted that the conductive structures 101 and the conductive vias 102 are illustrative, and the present disclosure is not limited thereto. In some embodiments, the conductive structures 101 and the conductive vias 102 include Cu, CuAl, Al, or any other suitable conductive material.

In some embodiments, an interconnect region 110 is formed on the semiconductor substrate 100. The interconnect region 110 includes at least one inter-layer dielectric (ILD) layer, which is formed over the semiconductor substrate 100. In accordance with some embodiments, the ILD layer includes silicon oxide, phosphosilicate glass (PSG), borosilicate glass (BSG), boron-doped phosphosilicate glass (BPSG), fluorine-doped silicate glass (FSG), or the like. The ILD layer may be formed using spin coating, Flowable Chemical Vapor Deposition (FCVD), Plasma Enhanced Chemical Vapor Deposition (PECVD), Low Pressure Chemical Vapor Deposition (LPCVD), or the like.

In addition, the interconnect region 110 further includes a plurality of conductive wires 111 and a plurality of conductive vias 112 electrically connected to the conductive structures 101 for transmitting electrical signals. The conductive wires 111 and the conductive vias 112 may be collectively referred to as an interconnect structure. In some embodiments, the interconnect structure interconnects the electrical components in the semiconductor structure 10 to form functional circuits. In some embodiments, the conductive vias 112 are electrically connected to the conductive wires 111. In some other embodiments, the conductive vias 112 are electrically isolated from the conductive wires 111. In some embodiments, the conductive vias 112 are each aligned with the conductive vias 102. In some other embodiments, the conductive vias 112 are each offset from the conductive vias 102.

Next, a plurality of conductive features 120 are formed over the interconnect region 110, for example, over the conductive vias 112. Each of the conductive features 120 may be centered with respect to the underlying conductive vias 112, or may be off-center with respect to the underlying conductive vias 112. The conductive features 120 may be conductive pads, include an electrically conductive material, such as aluminum, copper or an alloy thereof (e.g., a copper-silver alloy, a copper-cobalt alloy, or the like), and may be formed using a suitable formation method such as electroplating, electroless plating, or the like. The shape of the cross-section of the conductive features 120 may be a rectangular (or square) shape, a concave shape, a polygon shape, or a dome shape (e.g., with a curved upper surface), as examples. Note that in FIG. 1, the sizes (e.g. the width measured in the X-axis) of conductive features 120 are substantially equal to each other. In some embodiments, some of the conductive features 120 are larger (e.g., having a larger width measured in the X-axis) than other conductive features 120.

Figure 2A:
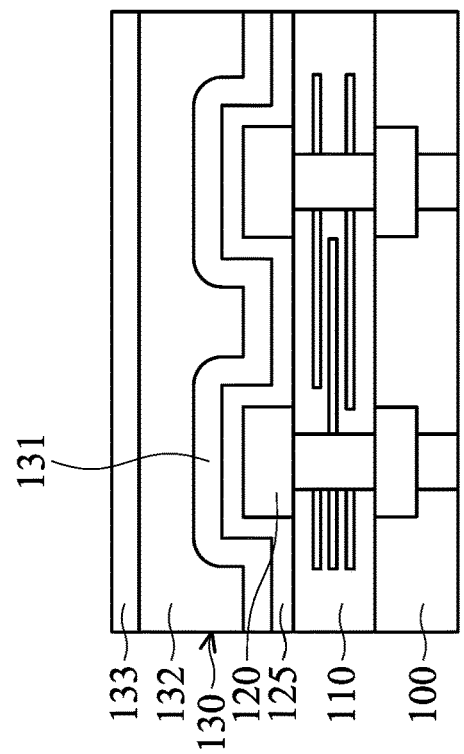
Figure 2B:
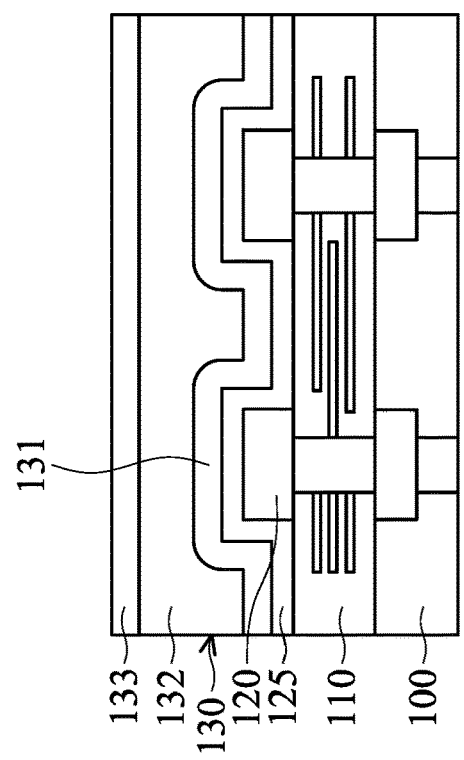

It should be noted that in the following embodiments, the drawings that share corresponding numerals (for example, FIGS. 2A and 2B, FIGS. 3A and 3B, etc.) show different portions of the semiconductor structure 10. To be more specific, for example, the portions shown in FIGS. 2A and 2B are located at different positions on the X-Y plane, and are located at substantially the same height in the Z axis. However, the present disclosure is not limited thereto.

As shown in FIGS. 2A and 2B, an etch stop layer (ESL) 125 is formed over the interconnect region 110 and conductive features 120. In some embodiments, the etch stop layer 125 is conformally formed over the interconnect region 110 and conductive features 120. In some embodiments, the material of the etch stop layer 125 is made of silicon nitride, silicon oxynitride, and/or other applicable materials. Moreover, the etch stop layer 125 is formed by plasma enhanced CVD, low-pressure CVD, atomic layer deposition (ALD), or other applicable processes. In some embodiments, before forming the etch stop layer 125, an anti-reflection layer may be (e.g. conformally) formed on the interconnect region 110 and conductive features 120 to facilitate the formation of the etch stop layer 125, and the etch stop layer 125 is formed on the anti-reflection layer.

In some embodiments, a first passivation layer 130 is formed over the interconnect structure 106 and the conductive features 120. The passivation layer 130 may include a plurality of sub-layers (see, e.g., 131-133 in FIGS. 2A and 2B) and may be formed of one or more suitable dielectric materials such as undoped silicate glass (USG), silicon oxide, silicon nitride, low-k dielectrics such as carbon doped oxides, extremely low-k dielectrics such as porous carbon doped silicon dioxide, combinations of these, or the like. The passivation layer 130 may be formed through a process such as chemical vapor deposition (CVD), FCVD, High-Density Plasma CVD (HDP CVD) although any suitable process may be utilized. In some embodiments, the sub-layers 131-133 are all made of different materials.

In some embodiments, the first passivation layer 130 includes a first sub-layer 131, a second sub-layer 132, and a third sub-layer 133. The first sub-layer 131 is formed over the etch stop layer 125 and the conductive features 120. In some embodiments, the first sub-layer 131 is substantially conformally formed on the etch stop layer 125. That is to say, the top surface of the first sub-layer 131 is not planar and has a curved section. In some embodiments, the top surface of the first sub-layer 131 is not parallel to a plane that is substantially parallel to the X-Y plane. For example, the material of the first sub-layer 131 includes undoped silicate glass. Of course, other suitable material may also be adopted.

In addition, the second sub-layer 132 is formed on the first sub-layer 131, and a bottom surface of the second sub-layer 132 is conformal to the top surface of the second sub-layer 132. In some embodiments, the top surface of the second sub-layer 132 is planar and substantially parallel to a plane that is substantially parallel to the X-Y plane. That is to say, the profile of the top surface of the sub-layer 131 is different from the profile of the top surface of the sub-layer 132.

In some embodiments, the third sub-layer 133 is formed on the second sub-layer 132, and therefore the second sub-layer 132 is sandwiched between the first sub-layer 131 and the third sub-layer 133. In some embodiments, a bottom surface of the third sub-layer 133 is conformal to the top surface of the first second sub-layer 132. In some embodiments, the top surface of the third sub-layer 133 is planar and substantially parallel to a plane that is substantially parallel to the X-Y plane. For example, the material of the third sub-layer 133 includes silicon nitride. Of course, other suitable material may also be adopted. For the sake of clarity, the first sub-layer 131, the second sub-layer 132, and the third sub-layer 133 are collectively referred to as the first passivation layer 130. In some embodiments, the first passivation layer 130 may be a multi-layered structure, and the number of the sub-layers of the first passivation layer 130 may be other than three.

Figure 3A:
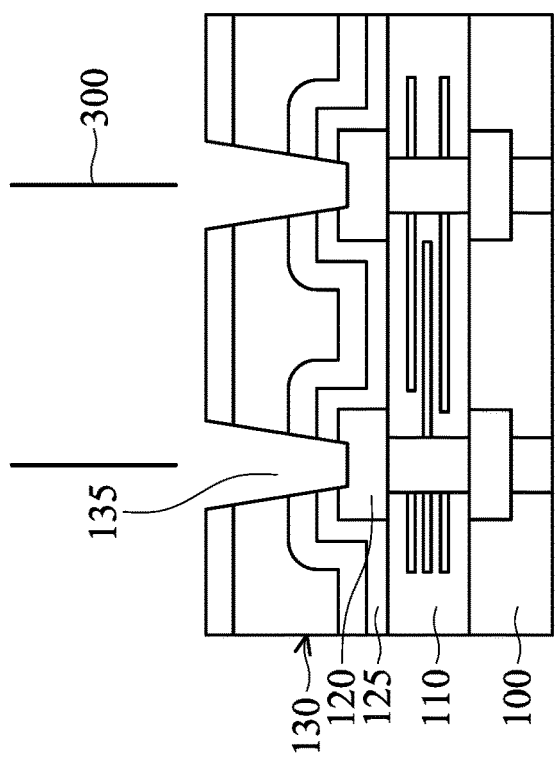
Figure 3B:
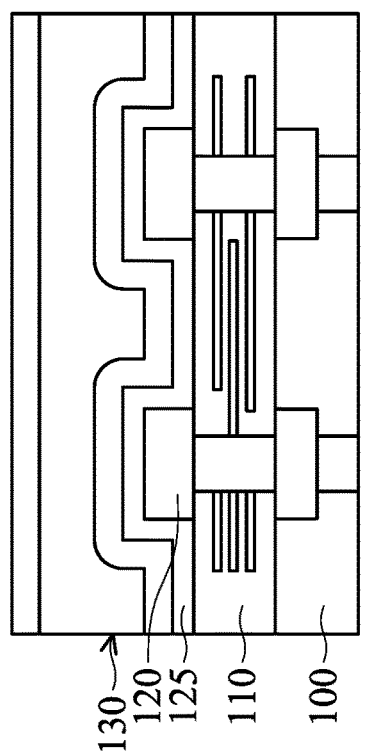

As shown in FIGS. 3A and 3B, a hard mask layer (not shown) may be deposited over the first passivation layer 130. In some embodiments, the hard mask layer may include a nitrogen-containing material and/or a carbon-containing material. For example, the hard mask layer may include SiOCN, SiCN, SiOC, SiC, SiN, or combinations thereof. In some embodiments, the hard mask layer may be conformally deposited and have a substantially uniform thickness.

The hard mask layer may be patterned to form openings. In various embodiments, a photolithography process (e.g., such as exposure and development) may be used to pattern the hard mask layer. An etching process may be performed using the hard mask layer to form first openings 135 in the first passivation layer 130. In some embodiments, a chemical mechanical planarization (CMP) process may be used to remove the hard mask layer to expose the underlying first passivation layer 130. Due to the formation of the etch stop layer 125, the etching process is less likely to damage the conductive features 120. Each of the first openings 135 exposes the corresponding conductive feature 120. In some embodiments, the sidewalls of the first passivation layer 130 facing the first openings 135 are inclined. In some other embodiments, the sidewalls of the first passivation layer 130 facing the first openings 135 are vertical and substantially to the Z axis.

In some embodiments, a plurality of probes 300 may be used to conduct an electrical test (for example, a wafer acceptance test (WAT) or any other test) to the conductive features 120 for determining whether the semiconductor structure 10 performs in a high-quality manner. If the semiconductor structure 10 passes the electrical test, the subsequent processes may be performed. Otherwise, a semiconductor structure 10 that fails the electrical test may be withdrawn, thereby the yield of the semiconductor structure 10 may be increased, saving time and money. In some embodiments, the number of the probes 300 corresponds to the number of the plurality of first openings 135 (which is equal to the number of the conductive features 120). In some embodiments, the probes 300 are moved to be aligned with the first openings 135 (i.e. the conductive features 120). In some embodiments, the semiconductor structure 10 is moved so as the first openings 135 (i.e. the conductive features 120) are aligned with the probes 300.

Figure 4B:
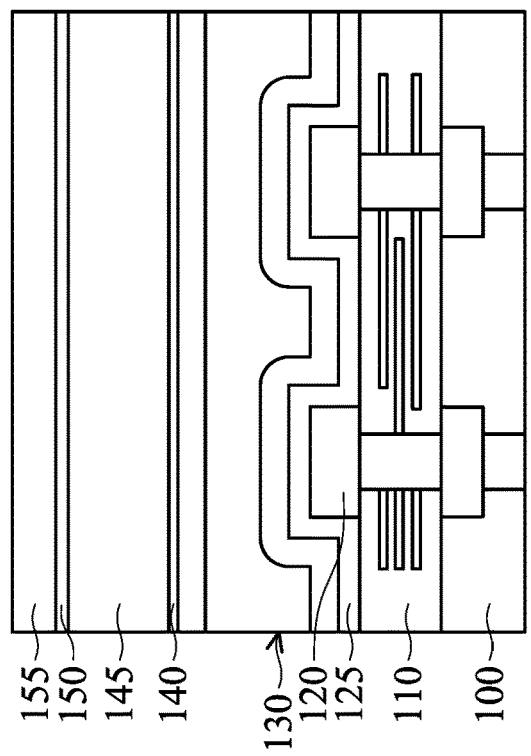
Figure 4A:
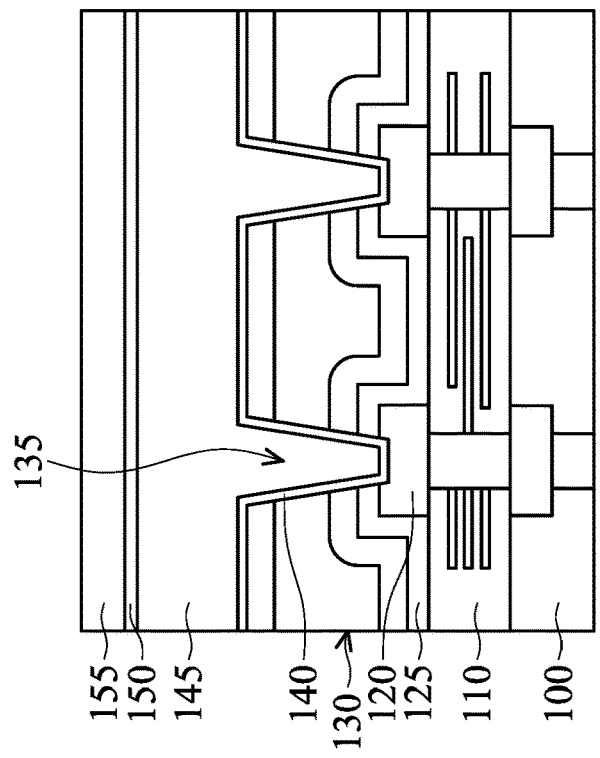

As shown in FIGS. 4A and 4B, in response to that the semiconductor structure 10 passes the electrical test, the subsequent processes may be performed. In some embodiments, an anti-reflection layer 140 is (e.g. conformally) formed on the top surface and the sidewalls of the first passivation layer 130, wherein each sidewalls of the first passivation layer 130 face one of the first openings 135. In addition, an oxide material 145 overfills the first openings 135 and extends over the top surface of the first passivation layer 130. Similarly, the formation of the anti-reflection layer may facilitate the formation of the oxide material 145. In some embodiments, a plurality of bonding layers 150 and 155 are formed over the oxide material 145 for bonding a carrier substrate 200 in the subsequent process. In some embodiments, the bonding layers 150 and 155 may be replaced with a single-layered bonding layer or a multi-layered layered bonding layer, as long as the carrier substrate 200 may be firmly bonded to the semiconductor structure 10.

Figure 5A:
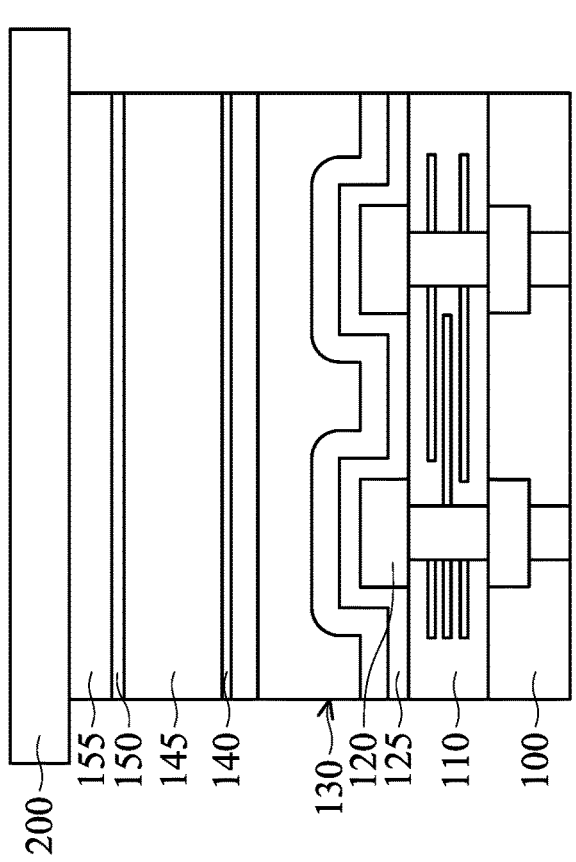
Figure 5B:
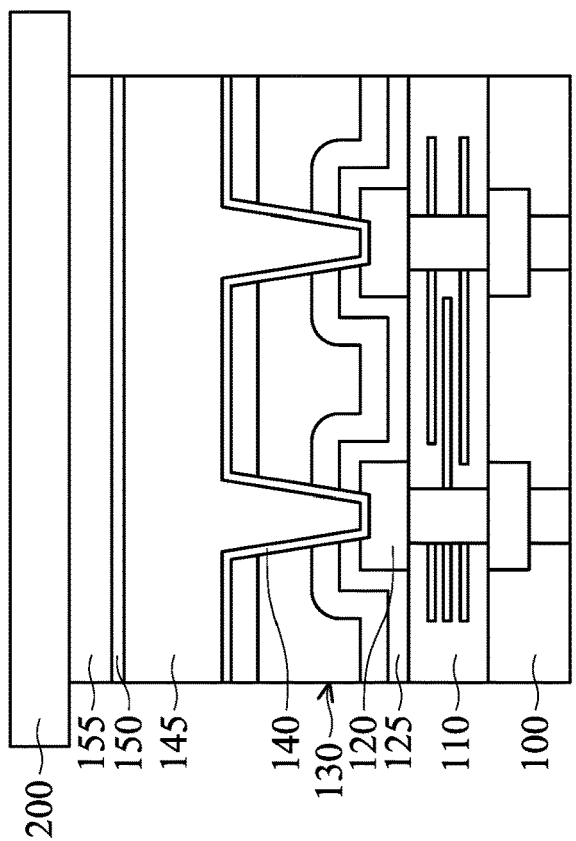

As shown in FIGS. 5A and 5B, the carrier substrate 200 is provided and configured to provide temporary mechanical and structural support during subsequent processing steps, in accordance with some embodiments. In some embodiments, the carrier substrate 200 may be a wafer. In some embodiments, the carrier substrate 200 includes glass, silicon oxide, aluminum oxide, metal, a combination thereof, and/or the like. The carrier substrate 200 include one or more die structure (not shown) disposed over the carrier substrate 200. The die structure may be a "known-good-die". In some embodiments, the one or more die structure may be a system-on-chip (SoC) chip or a system on integrated circuit (SoIC) device that includes two or more chips with integrated function. As the integration of the one or more die structure to the semiconductor structure 10, the performance of the semiconductor structure 10 may be enhanced, or the semiconductor structure 10 may perform variable function as designed, depending on the integrated die structure(s).

Figure 6B:
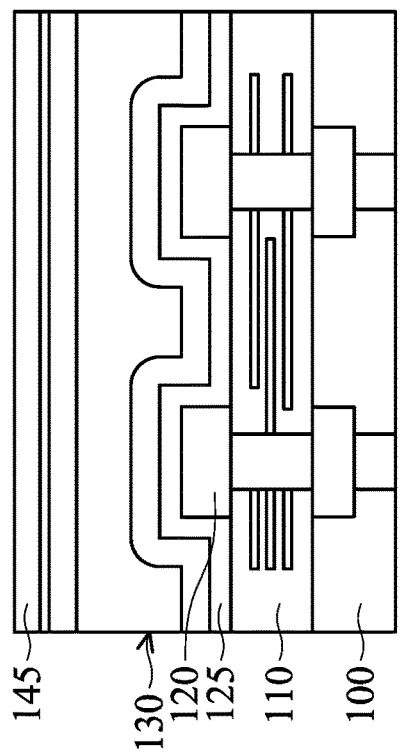
Figure 6A:
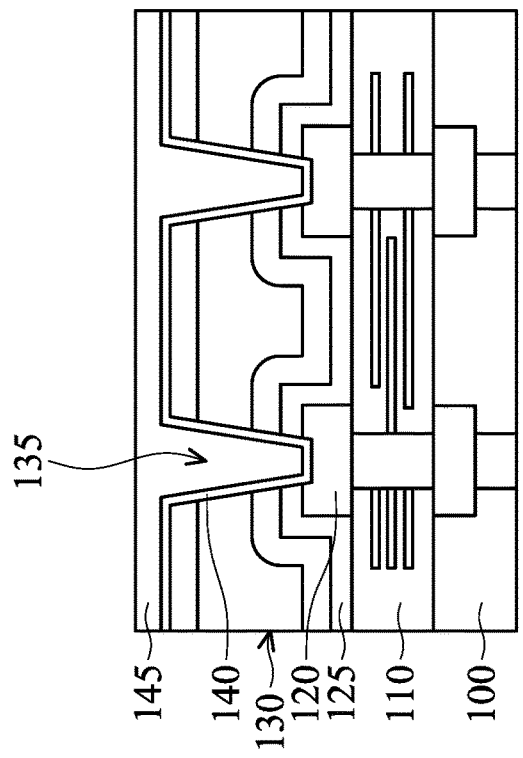

As shown in FIGS. 6A and 6B, after the integration of the one or more die structure, the carrier substrate 200 and the bonding layers 150 and 155 are removed. For example, a chemical mechanical planarization (CMP) process may be used to remove the carrier substrate 200 and the bonding layers 150 and 155 to expose the underlying oxide material 145. Of course, other suitable planarization processes may also be adopted. In some embodiments, during the removal of the carrier substrate 200 and the bonding layers 150 and 155, a portion of the oxide material 145 is also removed. That is to say, the oxide material 145 is thinned during the chemical mechanical planarization process (or the planarization process).

Figure 7B:
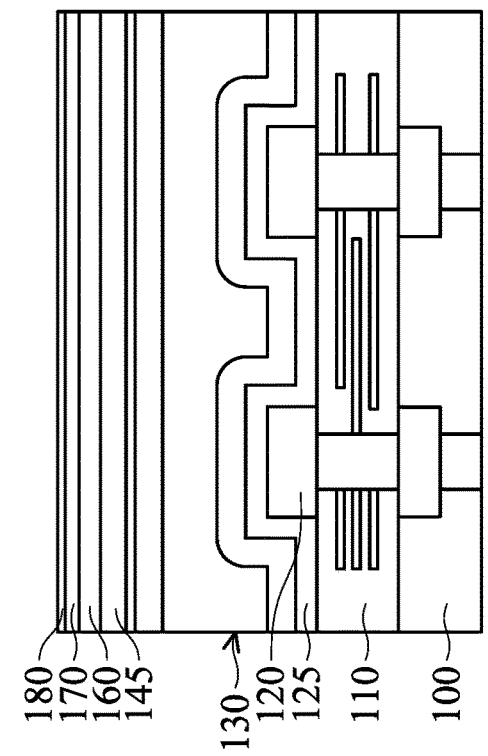
Figure 7A:
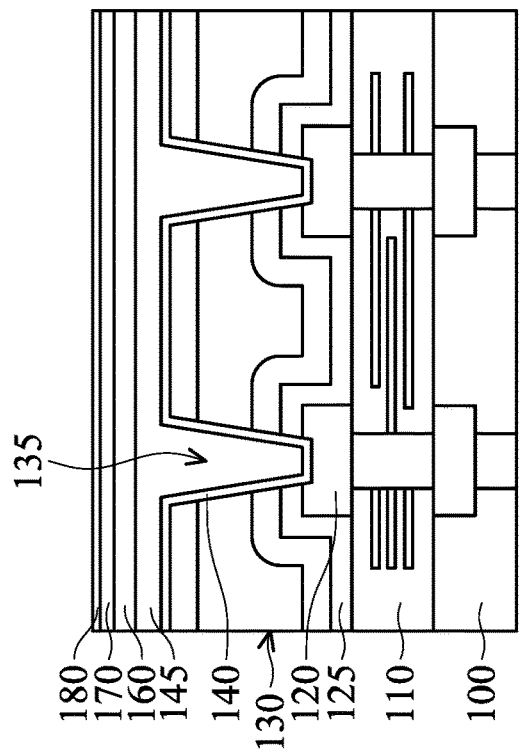

As shown in FIGS. 7A and 7B, an adhesive layer 160 is formed over the processed oxide material 145 for attaching a second passivation layer 170 to be formed. For example, the material of the adhesive layer 160 includes undoped silicate glass (USG), SiON, tetraethoxysilane (TEOS) oxide, high-density plasma (HDP) oxide, any other suitable material or a combination thereof. In some embodiments, the adhesive layer 160 may be omitted. The second passivation layer 170 is formed over the oxide material 145, and attached to the adhesive layer 160 (if the adhesive layer 160 is present). The formation of the adhesive layer 160 helps to enhance the attachment between the second passivation layer 170 and the oxide material 145, increasing the structural strength of the semiconductor structure. The second passivation layer 170 may be a single-layered structure. However, it is noted that the second passivation layer 170 may include multiple sub-layers, which is similar to the first passivation layer 130. In some embodiments, the second passivation layer 170 may be formed of one or more suitable dielectric materials such as undoped silicate glass (USG), silicon oxide, silicon nitride, low-k dielectrics such as carbon doped oxides, extremely low-k dielectrics such as porous carbon doped silicon dioxide, combinations of these, or the like. The second passivation layer 170 may be formed through a process such as chemical vapor deposition (CVD), FCVD, High-Density Plasma CVD (HDP CVD) although any suitable process may be utilized. In some embodiments, an anti-reflection layer 180 is formed over the second passivation layer 170.

In some embodiments, a hard mask layer (not shown) may be deposited over the second passivation layer 170 and the anti-reflection layer 180. In some embodiments, the hard mask layer may include a nitrogen-containing material and/or a carbon-containing material. For example, the hard mask layer may include SiOCN, SiCN, SiOC, SiC, SiN, or combinations thereof. In some embodiments, the hard mask layer may be conformally deposited and have a substantially uniform thickness. The hard mask layer may be patterned to form openings. In various embodiments, a photolithography process (e.g., such as exposure and development) may be used to pattern the hard mask layer. An etching process may be performed using the hard mask layer to form a plurality of second openings 175 to expose the conductive features 120. In some embodiments, a chemical mechanical planarization (CMP) process may be used to remove the hard mask layer.

Figure 8A:
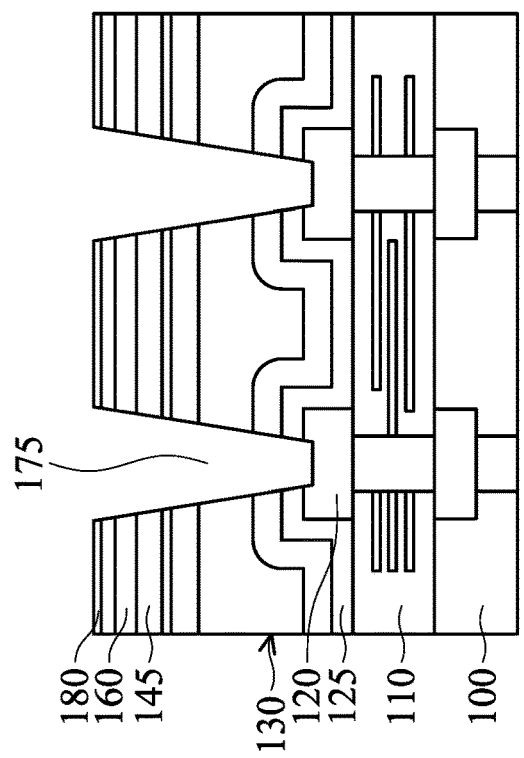
Figure 8B:
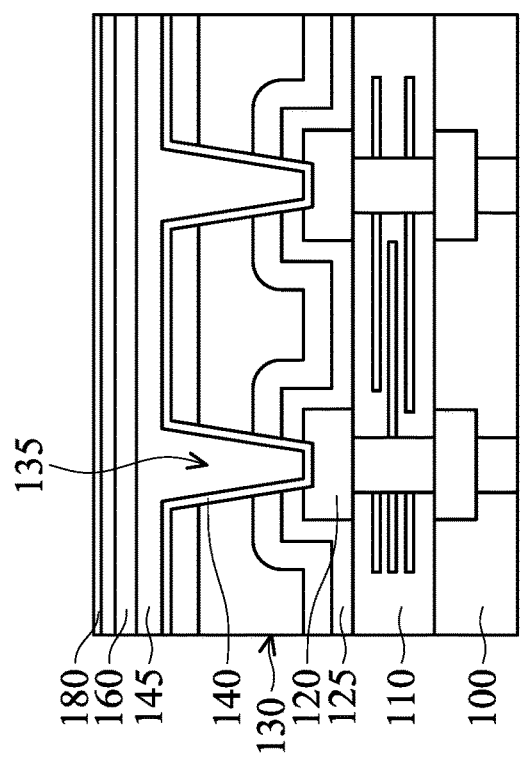

As shown in FIGS. 8A and 8B, the second openings 175 are spaced apart from the first openings 135. In some embodiments, the size of the portion of the conductive features 120 exposed by the first openings 135 (see, for example, FIG. 3A) is substantially the same as the size of the portion of the conductive features 120 exposed by the second openings 175. To be more specific, the size of the exposed portion of the conductive features 120 may be measured as a width or an area on a plane that is substantially coplanar to the X-Y plane.

Figure 9A:
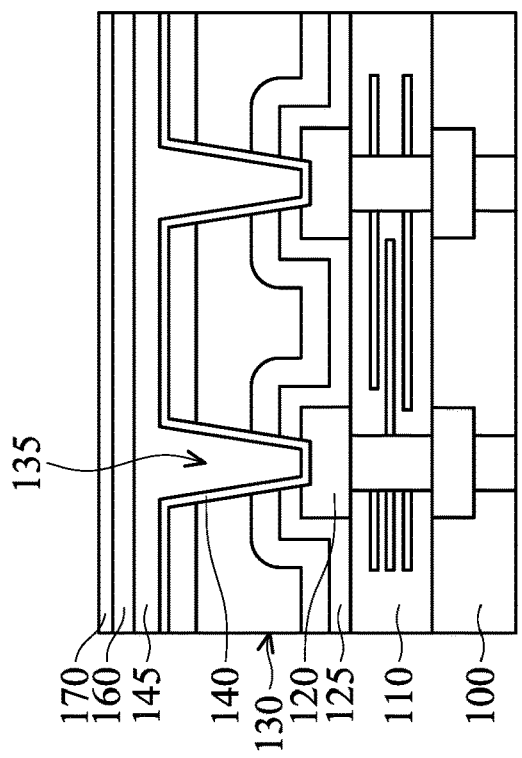
Figure 9B:
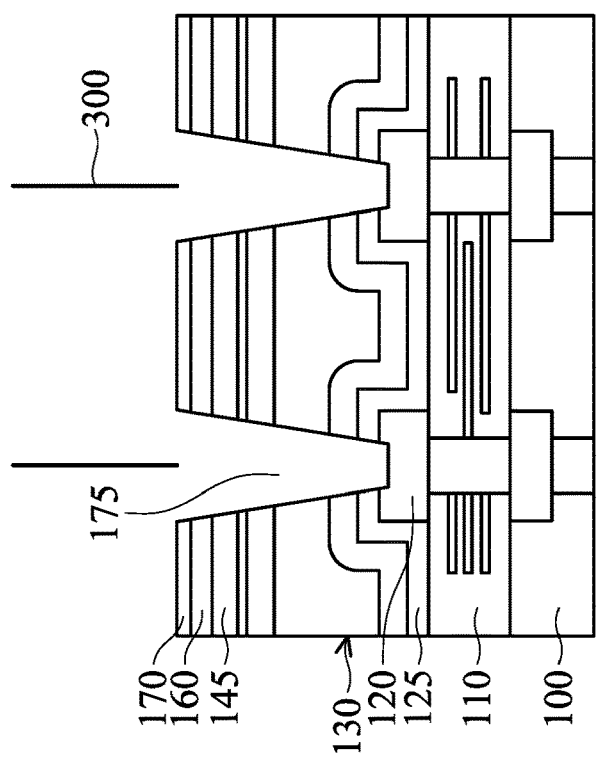

As shown in FIGS. 9A and 9B, after the formation of the second openings 175, the anti-reflection layer 180 is removed, and the probes 300 may be used to conduct an electrical test (for example, a wafer acceptance test (WAT) or any other test) to the conductive features 120 for determining whether the semiconductor structure 10 performs in a high-quality manner. If the semiconductor structure 10 passes the electrical test, the subsequent processes may be performed. Otherwise, a semiconductor structure 10 that fails the electrical test may be withdrawn. By conducting multiple electrical tests at different stages of the process of manufacturing the semiconductor structure 10, it is more likely to detect a malfunctioning semiconductor structure 10 as early as possible, thereby the yield of the semiconductor structure 10 may be increased, saving time and money. In some embodiments, the anti-reflection layer 180 is removed before the electrical test is conducted by the probes 300. In some other embodiments, the anti-reflection layer 180 is removed after the electrical test is conducted by the probes 300.

In some embodiments, the number of the probes 300 corresponds to the number of the plurality of second openings 175 (which is equal to the number of the conductive features 120). In some embodiments, the probes 300 are moved to be aligned with the second openings 175 (i.e. the conductive features 120). In some embodiments, the semiconductor structure 10 is moved so as the second openings 175 (i.e. the conductive features 120) are aligned with the probes 300. In some embodiments, the probes 300 shown in FIG. 9B are the same as the probes 300 shown in FIG. 3A and configured to conduct the identical electrical test. In some other embodiments, the probes 300 shown in FIG. 9B are different from the probes 300 shown in FIG. 3A and configured to conduct different electrical tests.

Figure 10A:
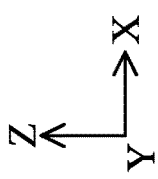
Figure 10A:
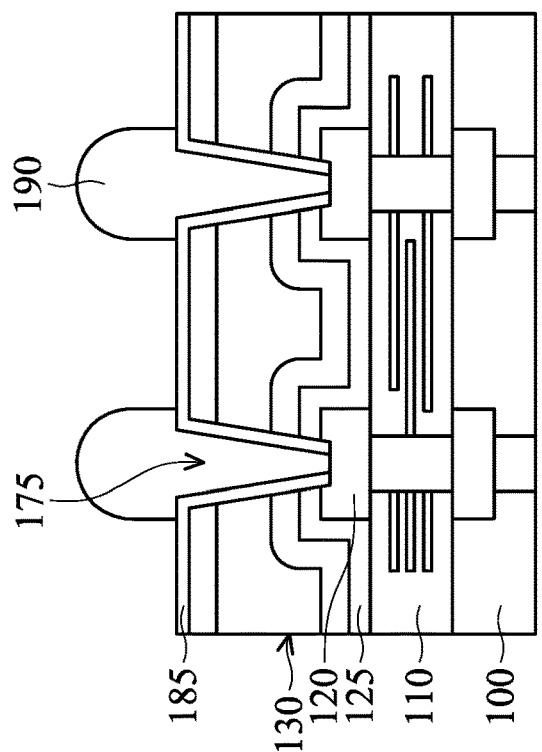
Figure 10B:
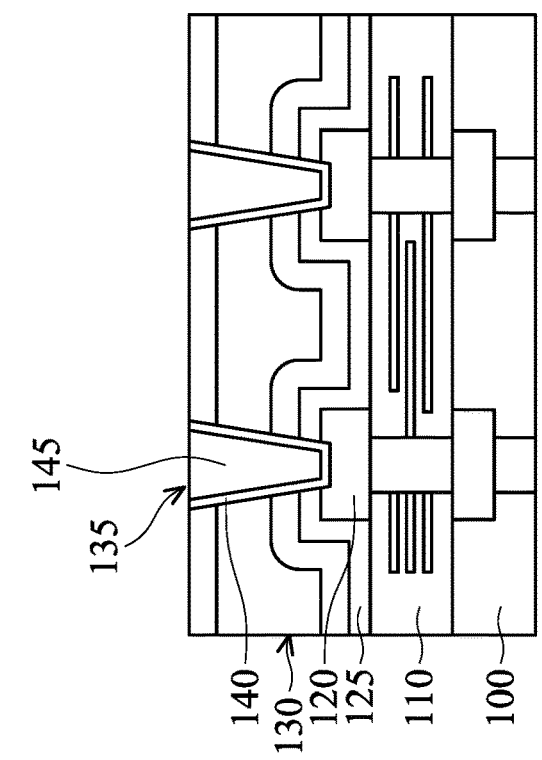

As shown in FIGS. 10A and 10B, the second passivation layer 170 and the adhesive layer 160 (if the adhesive layer 160 is present) are removed for forming a plurality of bump structures. In some embodiments, a polymeric layer 185 may be formed over the first passivation layer 130 and on the surfaces of the second openings 175. The polymeric layer 185 may include polyimide (PI). The polymeric layer 185 may be conformally deposited over the first passivation layer 130 and into the second openings 175 using a suitable deposition technique, such as spin-coating. In some embodiments, a baking process may be performed after deposition of the polymeric layer 185. The deposited polymeric layer 185 may then be patterned using a suitable combination of photolithography processes (e.g., such as photoresist deposition, exposure, and development) to form an etch mask, and an etching process may be performed using the etch mask to expose top surfaces of the conductive features 120. A plurality of conductive bump structures 190 may be formed in the second openings 175. The conductive bump structures 190 may include conductive materials with low resistivity, such as solder or solder alloy. Exemplary elements included in the solder alloy include Sn, Pb, Ag, Cu, Ni, Bi or combinations thereof.

In some embodiments, the conductive bump structures 190 may also be formed in the first openings 135. To be more specific, the anti-reflection layer 140 on the sidewalls of the first passivation layer 130 and the oxide material 145 in the first openings 135 are removed by, for example, an etching process. Accordingly, the polymeric layer 185 may be formed over the first passivation layer 130 and on the surfaces of the first openings 135, and the conductive bump structures 190 may be formed in the first openings 135.

Figure 11:
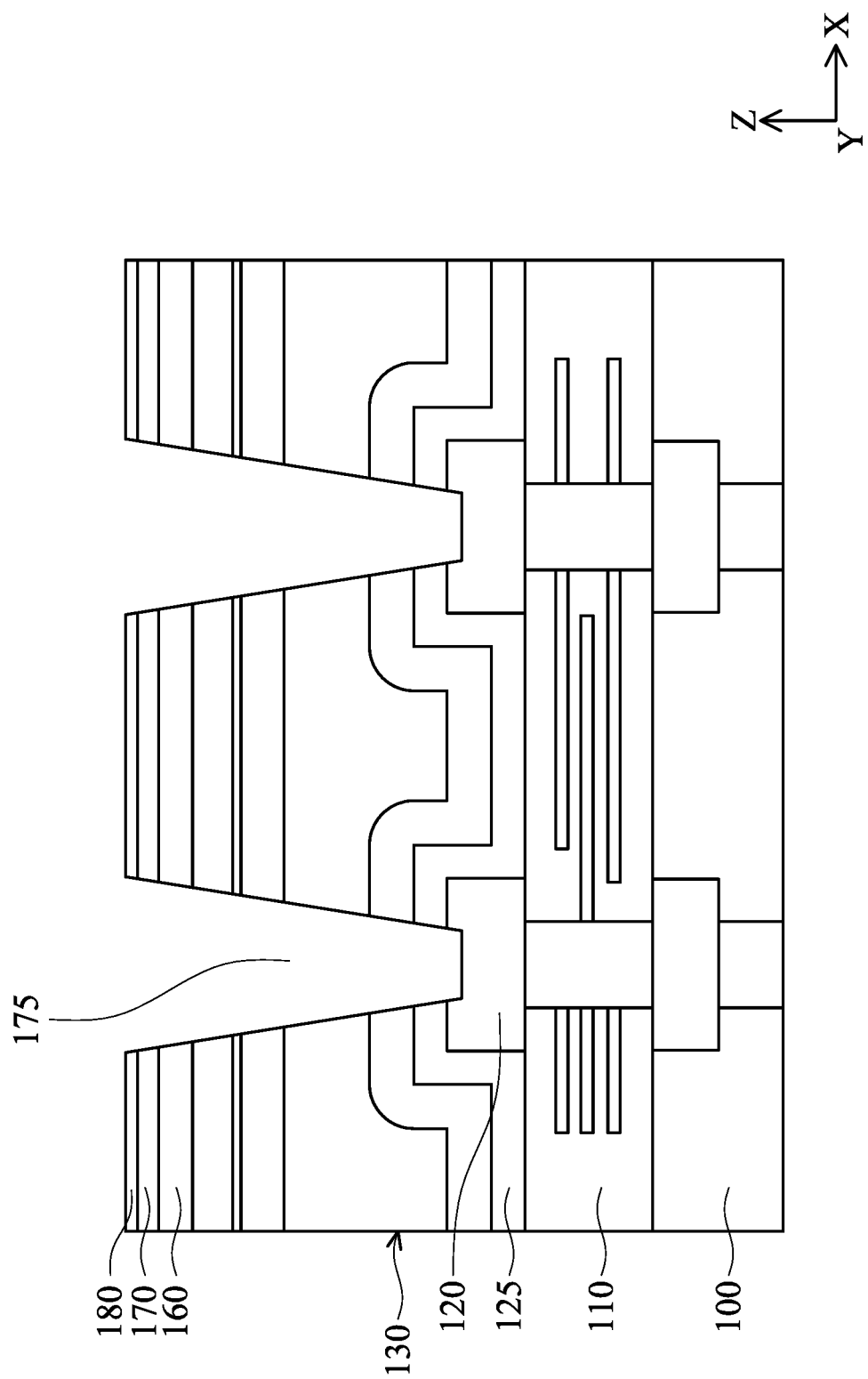
FIGS. 11-13 are cross-sectional views illustrating various stages of forming a semiconductor structure, in accordance with some embodiments of the disclosure.
Figure 12:
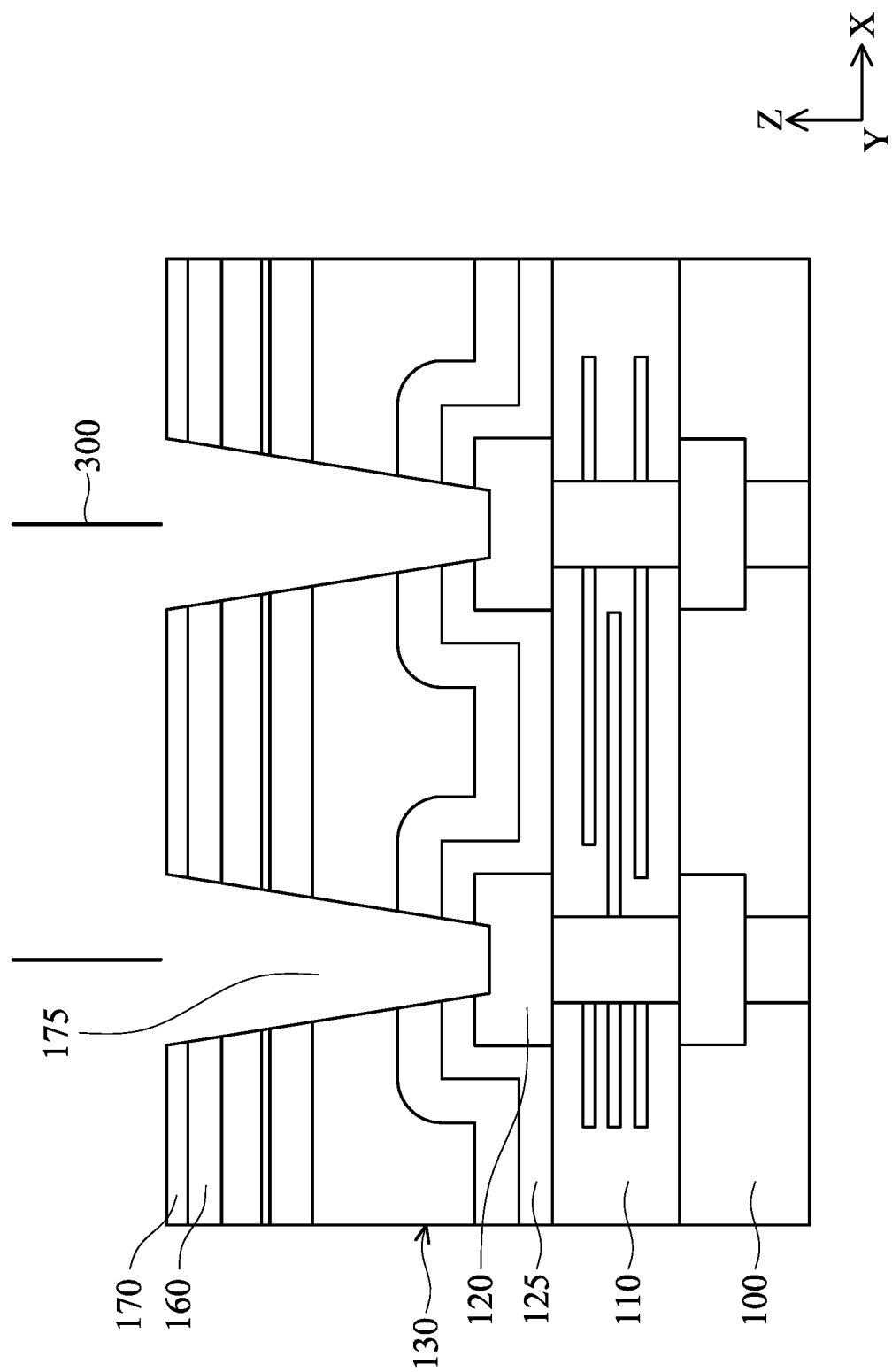
Figure 13:
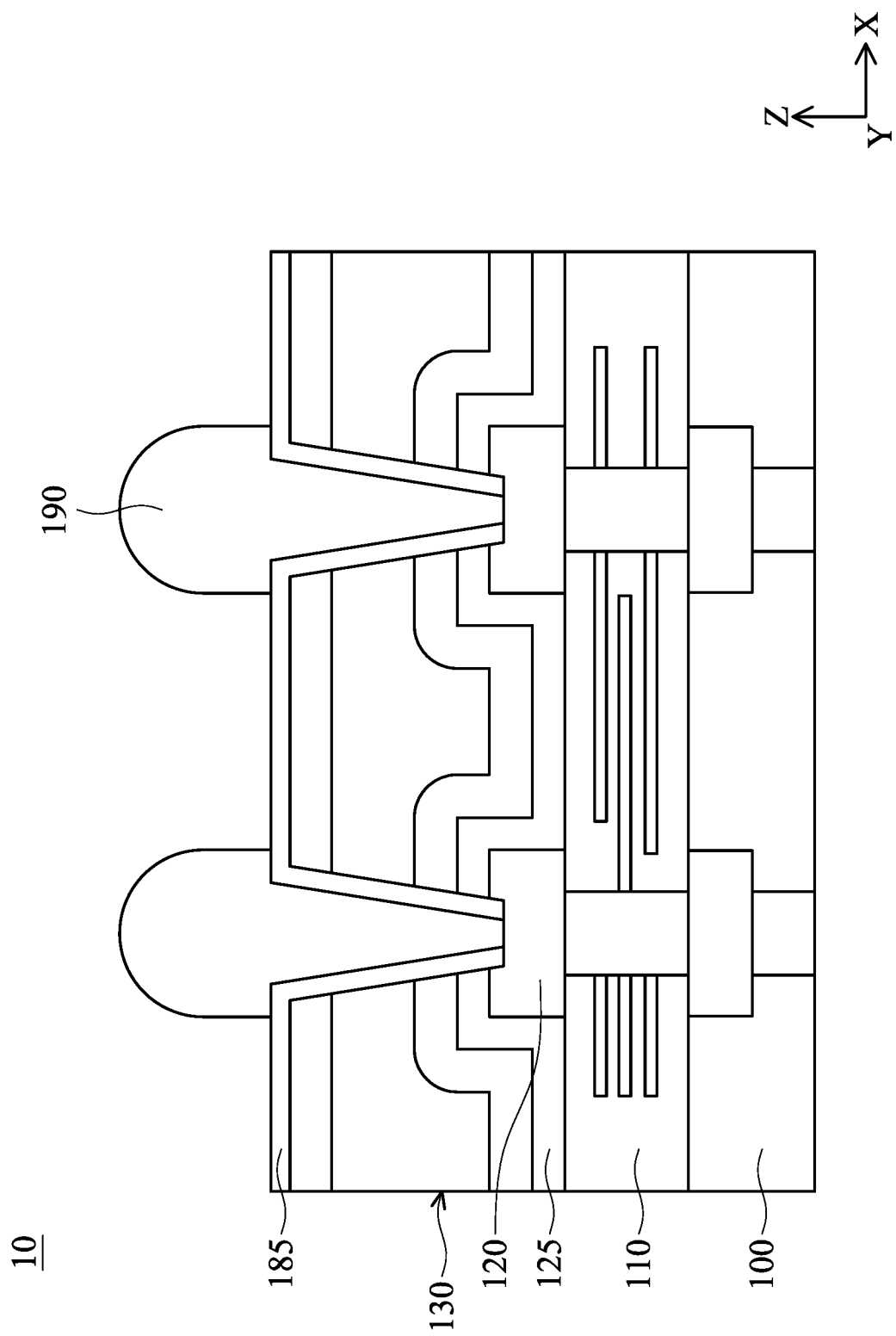

FIGS. 11-13 are cross-sectional views illustrating various stages of forming a semiconductor structure 10, in accordance with some embodiments of the disclosure. It is noted that the embodiment shown in FIGS. 11-13 may continue from the embodiment shown in FIG. 7A. That is to say, the discussion of the embodiments shown in FIGS. 1 through 7A also applies to the embodiment shown in FIGS. 11-13. For the sake of simplicity, the repeated elements/portions will be labeled as the same numerals, and the detailed discussion of these elements/portions will not be repeated in the following paragraphs.

In some embodiments, a hard mask layer (not shown) may be deposited over the second passivation layer 170 and the anti-reflection layer 180. In some embodiments, the hard mask layer may include a nitrogen-containing material and/or a carbon-containing material. For example, the hard mask layer may include SiOCN, SiCN, SiOC, SiC, SiN, or combinations thereof. In some embodiments, the hard mask layer may be conformally deposited and have a substantially uniform thickness. The hard mask layer may be patterned to form openings. In various embodiments, a photolithography process (e.g., such as exposure and development) may be used to pattern the hard mask layer. An etching process may be performed using the hard mask layer to form a plurality of second openings 175 to expose the conductive features 120. In some embodiments, a chemical mechanical planarization (CMP) process may be used to remove the hard mask layer. As shown in FIG. 11, the second openings 175 expose the same portion of the conductive features as the first openings 135. To be more specific, the anti-reflection layer 140 on the sidewalls of the first passivation layer 130 and the oxide material 145 in the first openings 135 are removed by the etching process forming the second openings 175.

As shown in FIG. 12, after the formation of the second openings 175, the anti-reflection layer 180 is removed, and the probes 300 may be used to conduct an electrical test (for example, a wafer acceptance test (WAT) or any other test) on the conductive features 120 for determining whether the semiconductor structure 10 performs in a high-quality manner. If the semiconductor structure 10 passes the electrical test, the subsequent processes may be performed. Otherwise, a semiconductor structure 10 that fails the electrical test may be withdrawn. It is noted that in the present embodiment, the electrical tests are performed to the same conductive features 120. In some embodiments, the anti-reflection layer 180 is removed before the electrical test is conducted by the probes 300. In some other embodiments, the anti-reflection layer 180 is removed after the electrical test is conducted by the probes 300.

In some embodiments, the number of the probes 300 corresponds to the number of the plurality of second openings 175 (which is equal to the number of the conductive features 120). In some embodiments, the probes 300 are moved to be aligned with the second openings 175 (i.e. the conductive features 120). In some embodiments, the semiconductor structure 10 is moved so as the second openings 175 (i.e. the conductive features 120) are aligned with the probes 300. In some embodiments, the probes 300 shown in FIG. 12 are the same as the probes 300 shown in FIG. 3A and configured to conduct the identical electrical test. In some other embodiments, the probes 300 shown in FIG. 12 are different from the probes 300 shown in FIG. 3A and configured to conduct different electrical tests.

As shown in FIG. 13, the second passivation layer 170 and the adhesive layer 160 (if the adhesive layer 160 is present) are removed for forming a plurality of bump structures. In some embodiments, a polymeric layer 185 may be formed over the first passivation layer 130 and on the surfaces of the second openings 175. The polymeric layer 185 may include polyimide (PI). The polymeric layer 185 may be conformally deposited over the first passivation layer 130 and into the second openings 175 using a suitable deposition technique, such as spin-coating. In some embodiments, a baking process may be performed after deposition of the polymeric layer 185. The deposited polymeric layer 185 may then be patterned using a suitable combination of photolithography processes (e.g., such as photoresist deposition, exposure, and development) to form an etch mask, and an etching process may be performed using the etch mask to expose top surfaces of the conductive features 120. A plurality of conductive bump structures 190 may be formed in the second openings 175. The conductive bump structures 190 may include conductive materials with low resistivity, such as solder or solder alloy. Exemplary elements included in the solder alloy include Sn, Pb, Ag, Cu, Ni, Bi or combinations thereof.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

As described above, the present disclosure is directed to conducting multiple electrical tests at different stages of the process of manufacturing the semiconductor structure, it is more likely to detect a malfunctioning semiconductor structure as early as possible, thereby the yield of the semiconductor structure may be increased, saving time and money. In addition, the formation of the adhesive layer helps to enhance the attachment between the second passivation layer and the oxide material, increasing the structural strength of the semiconductor structure.

In accordance with some embodiments, a method for forming a semiconductor structure is provided. The method includes forming an interconnect structure; and forming a conductive feature electrically connected to the interconnect structure. The method also includes forming a first passivation layer over the interconnect structure and the conductive feature; and etching the first passivation layer to form an opening that exposes the conductive feature. The method further includes performing an electrical test on the conductive feature; filling the opening with an oxide material; and attaching a carrier substrate over the oxide material using a bonding layer.

In accordance with some embodiments, a method for forming a semiconductor structure is provided. The method includes forming a conductive feature over a substrate; and forming a first passivation layer over the substrate and the conductive feature. The method also includes etching the first passivation layer to form a first opening exposing the conductive feature; performing a first electrical test on the conductive feature; and filling the first opening with an oxide material. The method further includes attaching a carrier substrate over the oxide material; removing the carrier substrate; and forming a second passivation layer over the oxide material. In addition, the method includes forming an anti-reflection layer over the second passivation layer; forming a second opening to expose the conductive feature; and performing a second electrical test on the conductive feature.

In accordance with some embodiments, a method for forming a semiconductor structure is provided. The method includes forming an interconnect structure; forming a conductive feature electrically connected to the interconnect structure; and forming a first passivation layer over the interconnect structure and the conductive feature. The method also includes etching the first passivation layer to form a first opening exposing a first portion of the conductive feature; performing a first electrical test on the conductive feature; and filling the first opening with an oxide material. The method further includes attaching a carrier substrate over the oxide material using a bonding layer; removing the carrier substrate and the bonding layer; and forming a second passivation layer over the oxide material. In addition, the method includes forming a second opening exposing the first portion of the conductive feature; and performing a second electrical test on the conductive feature via the second opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming an interconnect structure;
   forming a conductive feature electrically connected to the interconnect structure;
   forming a first passivation layer over the interconnect structure and the conductive feature;
   etching the first passivation layer to form an opening exposing the conductive feature;
   performing an electrical test on the conductive feature;
   filling the opening with an oxide material; and
   attaching a carrier substrate over the oxide material using a bonding layer.

2. The method as claimed in claim 1, wherein the first passivation layer further comprises a plurality of sub-layers, and materials of the sub-layers are different.

3. The method as claimed in claim 2, wherein the opening penetrates all of the sub-layers of the first passivation layer.

4. The method as claimed in claim 1, wherein performing the electrical test on the conductive feature comprises using a probe to detect the conductive feature via the opening.

5. The method as claimed in claim 1, further comprising:
   forming a second passivation layer over the oxide material;
   forming an anti-reflection layer over the second passivation layer; and
   removing the anti-reflection layer.

6. The method as claimed in claim 5, further comprising:
forming an adhesive layer between the oxide material and the second passivation layer.

7. The method as claimed in claim 1, further comprising:
removing the oxide material in the opening; and
forming a bump structure in the opening.

8. A method for forming a semiconductor structure, comprising:
forming a conductive feature over a substrate;
forming a first passivation layer over the substrate and the conductive feature;
etching the first passivation layer to form a first opening exposing the conductive feature;
performing a first electrical test on the conductive feature;
filling the first opening with an oxide material;
attaching a carrier substrate over the oxide material;
removing the carrier substrate;
forming a second passivation layer over the oxide material;
forming an anti-reflection layer over the second passivation layer;
forming a second opening exposing the conductive feature; and
performing a second electrical test on the conductive feature.

9. The method as claimed in claim 8, wherein the second opening penetrates the first passivation layer, the second passivation layer, and the anti-reflection layer.

10. The method as claimed in claim 8, wherein the second opening is spaced apart from the first opening.

11. The method as claimed in claim 8, wherein the first passivation layer further comprises a plurality of sub-layers, and a profile of a top surface of one of the sub-layers is different from a profile of a top surface of another of the sub-layers.

12. The method as claimed in claim 8, further comprising:
removing the anti-reflection layer after forming the second opening exposing the conductive feature.

13. The method as claimed in claim 8, wherein a size of an exposed portion of the conductive feature by the first opening is substantially the same as a size of an exposed portion of the conductive feature by the second opening.

14. The method as claimed in claim 8, further comprising:
forming an adhesive layer between the oxide material and the second passivation layer, wherein the second opening penetrates the adhesive layer.

15. The method as claimed in claim 8, further comprising:
forming a bump structure in the second opening.

16. A method for forming a semiconductor structure, comprising:
forming an interconnect structure;
forming a conductive feature electrically connected to the interconnect structure;
forming a first passivation layer over the interconnect structure and the conductive feature;
etching the first passivation layer to form a first opening exposing a first portion of the conductive feature;
performing a first electrical test on the conductive feature;
filling the first opening with an oxide material;
attaching a carrier substrate over the oxide material using a bonding layer;
removing the carrier substrate and the bonding layer;
forming a second passivation layer over the oxide material;
forming a second opening exposing the first portion of the conductive feature; and
performing a second electrical test on the conductive feature via the second opening.

17. The method as claimed in claim 16, further comprising:
forming a first anti-reflection layer over a top surface and sidewalls of the first passivation layer, wherein the sidewalls of the first passivation layer face the first opening, and the first anti-reflection layer on the sidewalls of the first passivation layer is removed during the formation of the second opening.

18. The method as claimed in claim 16, further comprising:
forming a second anti-reflection layer over the second passivation layer prior to forming the second opening; and
removing the anti-reflection layer after forming the second opening.

19. The method as claimed in claim 16, further comprising:
forming an adhesive layer between the oxide material and the second passivation layer, wherein the second opening penetrates the adhesive layer.

20. The method as claimed in claim 16, further comprising:
forming a bump structure in the second opening.

* * * * *